US011710617B2

(12) United States Patent
Biloiu et al.

(10) Patent No.: US 11,710,617 B2
(45) Date of Patent: *Jul. 25, 2023

(54) RESONATOR COIL HAVING AN ASYMMETRICAL PROFILE

(71) Applicant: APPLIED Materials, Inc., Santa Clara, CA (US)

(72) Inventors: Costel Biloiu, Rockport, MA (US); Michael Honan, Peabody, MA (US); Robert B. Vopat, Austin, TX (US); David Blahnik, Round Rock, TX (US); Charles T. Carlson, Cedar Park, TX (US); Frank Sinclair, Boston, MA (US); Paul Murphy, Reading, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 83 days.

This patent is subject to a terminal disclaimer.

(21) Appl. No.: 17/378,327

(22) Filed: Jul. 16, 2021

(65) Prior Publication Data

US 2021/0343500 A1    Nov. 4, 2021

Related U.S. Application Data

(63) Continuation of application No. 16/734,746, filed on Jan. 6, 2020, now Pat. No. 11,094,504.

(51) Int. Cl.
*H01J 23/18* (2006.01)
*H01J 37/30* (2006.01)
*H01J 37/317* (2006.01)

(52) U.S. Cl.
CPC .......... *H01J 37/3007* (2013.01); *H01J 23/18* (2013.01); *H01J 37/3171* (2013.01); *H01J 2237/0473* (2013.01)

(58) Field of Classification Search
CPC ............... H01J 37/3007; H01J 37/3171; H01J 2237/0473; H01J 23/02; H01J 23/18;
(Continued)

(56) References Cited

U.S. PATENT DOCUMENTS 4,700,158 A * 10/1987 Dorsey .................. H01P 7/005
333/202
4,712,042 A    12/1987 Hamm
(Continued)

FOREIGN PATENT DOCUMENTS

EP    1014763 A2    6/2000
TW    398006 B    7/2000
(Continued)

OTHER PUBLICATIONS

International Search Report dated Apr. 8, 2021, for the International Patent Application No. PCT/US2020/063868, filed on Dec. 9, 2020, 4 pages.
(Continued)

*Primary Examiner* — Kiet T Nguyen
(74) *Attorney, Agent, or Firm* — KDW Firm PLLC

(57) ABSTRACT

Embodiments herein are directed to a resonator for an ion implanter. In some embodiments, a resonator may include a housing, and a first coil and a second coil partially disposed within the housing. Each of the first and second coils may include a first end including an opening for receiving an ion beam, and a central section extending helically about a central axis, wherein the central axis is parallel to a beamline of the ion beam, and wherein an inner side of the central section has a flattened surface.

19 Claims, 8 Drawing Sheets

(58) Field of Classification Search
CPC .......... H01J 23/20; H01J 23/213; H01J 25/02; H01J 25/58; H01P 7/005
USPC .......................... 250/492.21, 396 R, 396 ML
See application file for complete search history.

(56) References Cited

U.S. PATENT DOCUMENTS

| | | | |
|---|---|---|---|
| 5,351,023 A * | 9/1994 | Niiranen | H01P 7/005 333/202 |
| 5,504,341 A | 4/1996 | Slavish | |
| 6,208,095 B1 | 3/2001 | DiVergilio et al. | |
| 6,653,803 B1 | 11/2003 | DiVergilio et al. | |
| 2019/0088443 A1 | 3/2019 | Satoh | |

FOREIGN PATENT DOCUMENTS

| | | |
|---|---|---|
| TW | 584881 B | 4/2004 |
| WO | 2003-032694 A1 | 4/2003 |

OTHER PUBLICATIONS

Written Opinion dated Apr. 8, 2021, for the International Patent Application No. PCT/US2020/063868, filed on Dec. 9, 2020, 5 pages.

* cited by examiner

RESONATOR COIL HAVING AN ASYMMETRICAL PROFILE

CROSS-REFERENCE TO RELATED APPLICATION

This application is a continuation application of U.S. Non-Provisional application Ser. No. 16/734,746, filed Jan. 6, 2020, entitled "RESONATOR COIL HAVING AN ASYMMETRICAL PROFILE," the entire contents of which applications incorporated by reference herein.

FIELD OF THE DISCLOSURE

The present disclosure relates generally to high-energy ion implanters and, more particularly, to a helical resonator coil having an asymmetrical profile.

BACKGROUND OF THE DISCLOSURE

Fabrication of power electronics devices used, for example, for automotive applications, high resolution light sensors, and other complex 3D semiconductor structures, requires deep doping of semiconductor materials. This requirement translates into very high energies of the species to be implanted. For instance, to dope at 5 μm depth into silicon, the energy for B, P, and As may be 4.2 MeV, 10.5 MeV, and 14 MeV, respectively. Even using multiply charged ion species, these energies are not achievable in regular dc voltage accelerators because of vacuum breakdown limitation.

One method to obtain such high ion energies is radio frequency (RF) acceleration. For example, a linear accelerator uses a series of RF resonant cavities, which boost the ion energy from tens of keV to a few MeV. In a resonant RF cavity, the RF energy is transferred from the RF generator to an RLC circuit composed of a coil and a cavity. As the quality factor (Q) of the cavity goes higher, so does the available acceleration voltage. However, the quality factor is limited by the resistance of the system, mainly given by the resistance of the coil.

In some cases, the resistance of the RF resonant cavity can be decreased by increasing the size of a chamber defining the RF cavity. However, increasing the chamber size will also increase the cavity capacity and alter the resonant frequency. Furthermore, decreasing resistance of a junction to ground and a gap resistance are typically difficult to modify.

What is therefore needed is a solution to decrease system resistance and increase the quality factor.

SUMMARY OF THE DISCLOSURE

In one approach, a resonator may include a housing, and at least one coil disposed within the housing. The at least one coil may include a first end coupled to an electrode, the electrode operable to accelerate ions, and a central section connected to the first end, the central section extending helically about a central axis. An inner side of the central section may have a flattened surface, and an outer side of the central section may have a curved profile. The at least one coil may further include a second end connected to the central section, the second end coupled to the housing.

In another approach, a resonator of an ion implanter may include a housing defining an internal cavity, and a first coil partially disposed within the internal cavity. The first coil may include a first end coupled to a first electrode, the first electrode including a first opening for receiving an ion beam, and a first central section connected with the first end, wherein the first central section includes a first plurality of loops extending helically about a central axis, and wherein each of the first plurality of loops has a first flattened surface. The resonator may further include a second coil adjacent the first coil, the second coil including a second end coupled to a second electrode, the second electrode including a second opening for receiving the ion beam from the first electrode. The second coil may further include a second central section connected with the second end, wherein the second central section includes a second plurality of loops extending helically about the central axis, and wherein each of the second plurality of loops has a second flattened surface.

In yet another approach, a resonator of an ion implanter may include a housing defining an internal cavity, and a first hollow coil partially disposed within the internal cavity. The first hollow coil may include a first end extending outside the housing and coupled to a first electrode, the first electrode including a first opening for receiving an ion beam. The first coil may further include a first central section connected with the first end, wherein the first central section includes a first plurality of loops extending helically about a central axis, and wherein each of the first plurality of loops has a first flattened surface. The resonator may further include a second hollow coil adjacent the first coil within the internal cavity, the second hollow coil including a second end extending outside the housing and coupled to a second electrode, the second electrode including a second opening for receiving the ion beam from the first electrode. The second coil may further include a second central section connected with the second end, wherein the second central section includes a second plurality of loops extending helically about the central axis, and wherein each of the second plurality of loops has a second flattened surface.

Figure 1A:
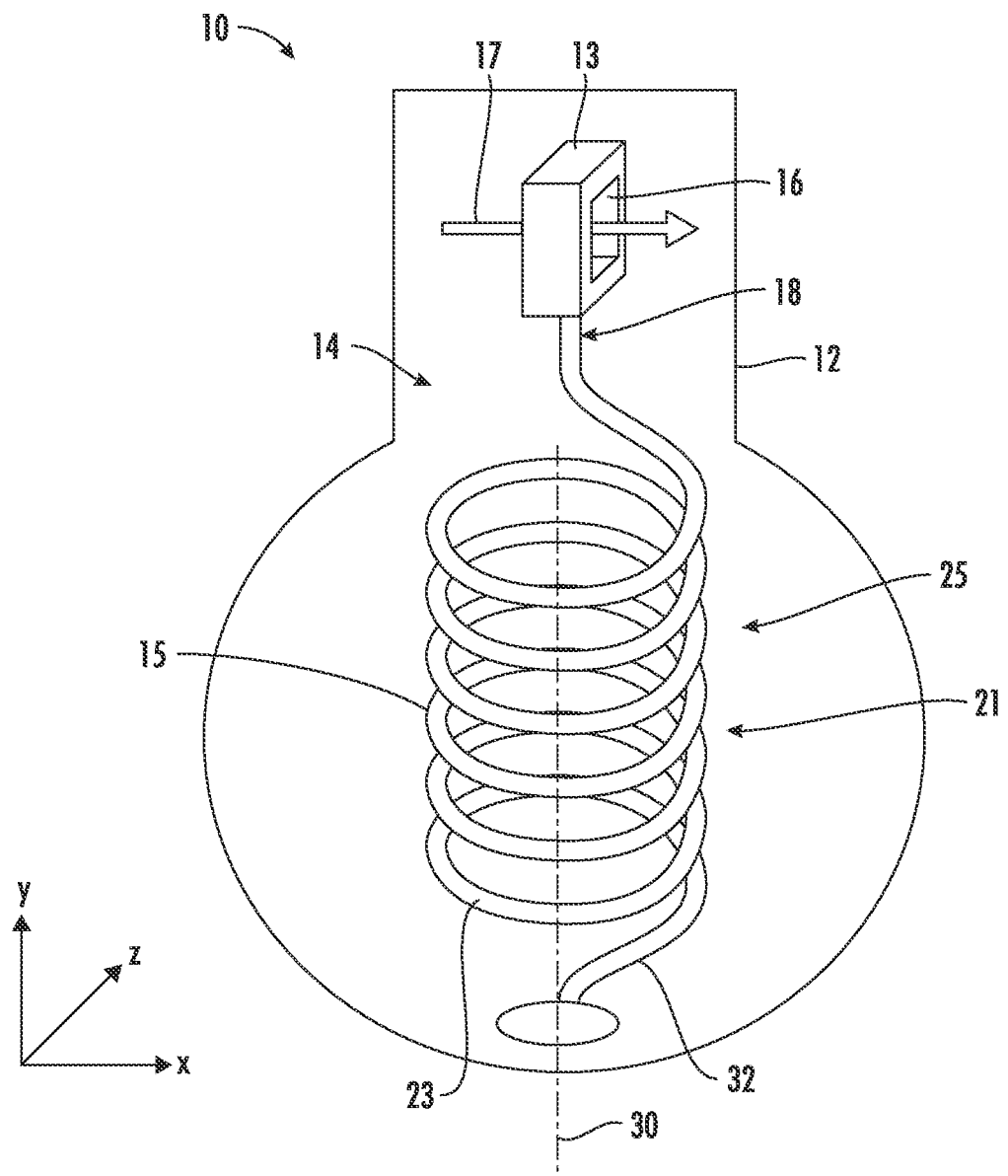
FIG. 1A depicts a perspective view of a resonator in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Ion implanters and resonators in accordance with the present disclosure will now be described more fully hereinafter with reference to the accompanying drawings, where embodiments of the methods are shown. The ion implanters and resonators may be embodied in many different forms and are not to be construed as being limited to the embodiments set forth herein. Instead, these embodiments are provided so this disclosure will be thorough and complete, and will fully convey the scope of the system and method to those skilled in the art.

Embodiments herein describe a compact, asymmetrical coil design useful for a linear accelerator resonator capable of resonating at a predetermined frequency. The resonator may include first and second coils disposed adjacent one another and helically disposed about a same central axis. Each of the first and second coils may be hollow, with a flattened surface along an interior side thereof. The coil design of the present embodiments decreases coil resistance and, consequently, increases the quality factor of a resonant cavity.

Turning now to FIG. 1A, a resonator 10 of an ion implanter according to embodiments of the present disclosure will be described. As shown, the resonator 10 may include a housing 12 defining an internal cavity 14. The housing 12 may be an electrically grounded conductive housing (e.g., aluminum) surrounding a radio frequency (RF) resonant internal cavity. Within the housing 12 is a coil assembly 25 including a coil 15. The first end 18 may be coupled to an electrode 13 having a slit or opening 16 formed therethrough. During use, an ion beam 17 may pass through the opening 16. A length, e.g., along the x-direction of the electrode 13, may be selected so that the ion beam 17 is accelerated across a first gap when entering the electrode 13, and then accelerated again when it leaves the electrode 13. During the time that the ion beam 17 is traversing a central portion of the opening 16, the RF voltage changes from negative to positive. Such an arrangement is sometimes referred to as a double gap accelerator.

As further shown, the first end 18 of the coil 15 may be connected to a central section 21, wherein the central section 21 includes a first plurality of segments or loops 23 extending helically about a central axis 30. In this embodiment, the central axis 30 may generally extend perpendicular to the direction of travel of the ion beam 17. A second end 32 of the coil 15 may be connected to the housing 12, which is at ground potential. As will be described in greater detail below, the coil 15 be made of hollow tubing with an approximately circular cross section including an inner side of the central section 21 having a flattened surface (not shown).

Figure 1B:
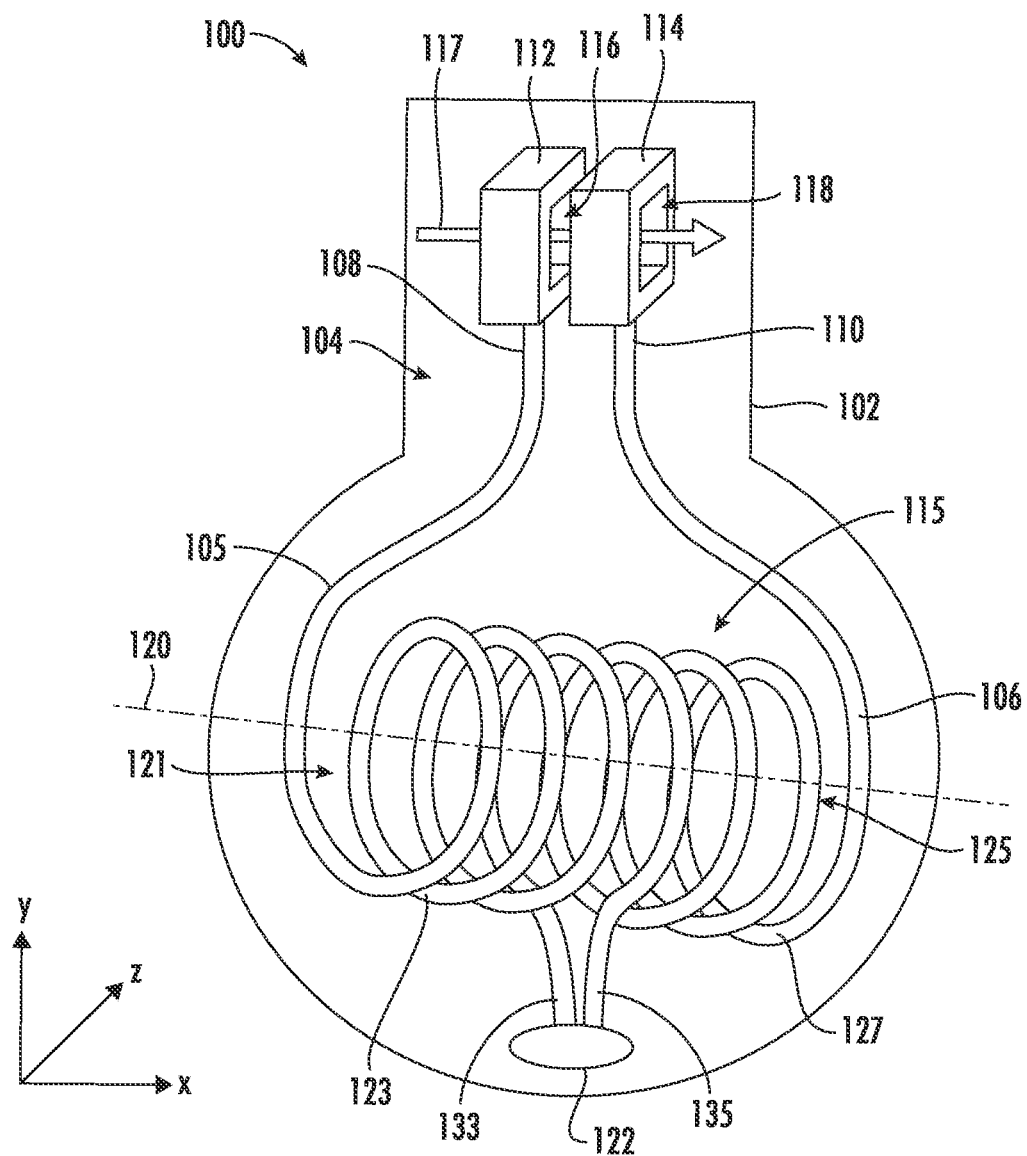
FIG. 1B depicts a perspective view of a resonator in accordance with embodiments of the present disclosure.

Turning now to FIG. 1B, a resonator 100 of an ion implanter according to embodiments of the present disclosure will be described. As shown, the resonator 100 may include a housing 102 defining an internal cavity 104. Within the housing 102 is a coil assembly 115 including a first coil 105 and a second coil 106. The first end 108 may be coupled to a first electrode 112, while the second end 110 may be coupled to a second electrode 114. The first electrode 112 may include a first slit or opening 116, and the second electrode 114 may include a second slit or opening 118. During use, an ion beam 117 may pass through the first and second openings 116, 118.

As further shown, the first end 108 of the first coil 105 may be connected to a first central section 121, wherein the first central section 121 includes a first plurality of segments or loops 123 extending helically about a central axis 120. In this embodiment, the central axis 120 may generally extend parallel to the direction of travel of the ion beam 117. The second end 110 of the second coil 106 may be connected to a second central section 125, wherein the second central section 125 includes a second plurality of segments or loops 127 extending helically about the central axis 120. As shown, the first plurality of loops 123 may generally be arranged end-to-end with the second plurality of loops 127.

The first and second coils 105, 106 may be symmetrically arranged with respect to the walls of the housing 102 and with respect to one another. As shown, the first and second coils 105, 106 are helices wound in a same direction and sharing the central axis 120. Respective second ends 133, 135 of the first and second coils 105, 106 may be connected by a plate 122 coupled to the housing 102, which may be grounded. In other embodiments, the first and second ends 133, 135 may be directly coupled to the housing 102.

As will be described in further detail herein, the first and second coils 105, 106 may further share a same/single magnetic field passing linearly along the central axis 120. In this arrangement, the ion beam 117 can be accelerated three times, i.e., first when the ion beam 117 enters the first electrode 112, then as the ion beam 117 is transmitted from the first electrode 112 to the second electrode 114 and, finally, when the ion beam 117 exits the second electrode 114. This is enabled by the RF voltage changing from negative on the first electrode 112 and positive on the second electrode 114 during the first gap acceleration, and then reversing polarity when the ion beam 117 goes between the first and second electrodes 112, 114. The ion beam 117 may then reverse polarity once more when exiting the second electrode 114. Such an arrangement is sometimes referred to as a triple gap accelerator.

In some embodiments, the first and second coils 105, 106 are copper tubes with an internal channel to permit a cooling fluid to flow therethrough. For example, internally flowing water within the first and second coils 105, 106 may help dissipate heat generated by electrical current traveling along the conductive material of the first and second coils 105, 106. As will be described in greater detail below, each of the first and second plurality of loops 123, 127 has a flattened inside surface facing the central axis 120.

Figure 2A:
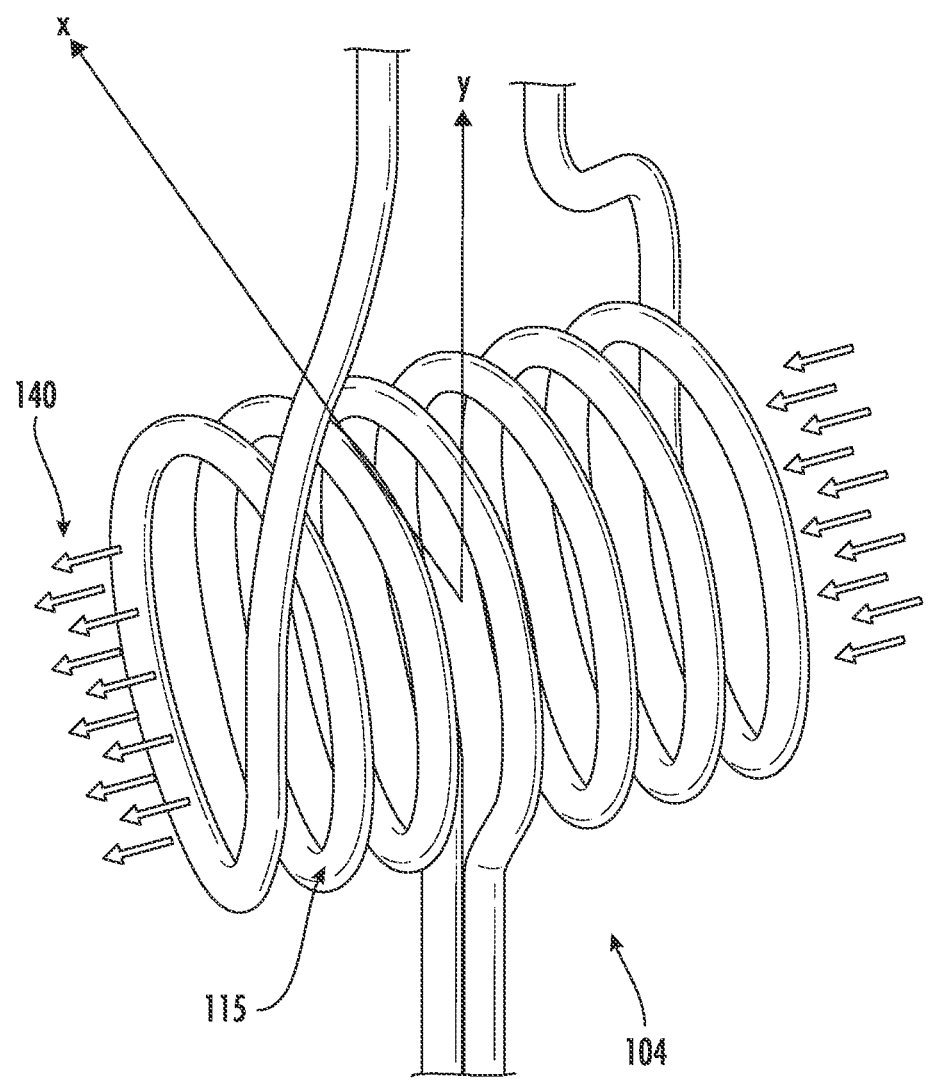
FIG. 2A depicts a perspective view of a coil assembly of the resonator of FIG. 1B in accordance with embodiments of the present disclosure.

The working principle of the resonator 100 is depicted in FIG. 2A. In this embodiment, RF energy may be transferred from an energy source (e.g., RF generator) through an exciter coil (not shown) and into the coil assembly 115. The energy is stored in the coil assembly 115 as magnetic energy given by the following:

$$W_{mag} = \frac{B^2}{2\mu_0} \quad (1)$$

where B represents a magnetic flux 140 and $\mu_0$ represents magnetic permeability of the vacuum within the internal cavity 104.

Because the internal cavity 104 forms an RLC circuit, it will oscillate with a certain frequency $f_0$, which at resonance, is given by the following:

$$f_0 = \frac{1}{2\pi\sqrt{LC}} \quad (2)$$

where L is the inductance of the coil assembly 115, and C the capacitance of the resonator 100. Under resonance conditions, the energy will transform periodically from magnetic energy, which manifests as magnetic flux 140 in the coil assembly 115, into electrostatic energy.

Figure 2B:
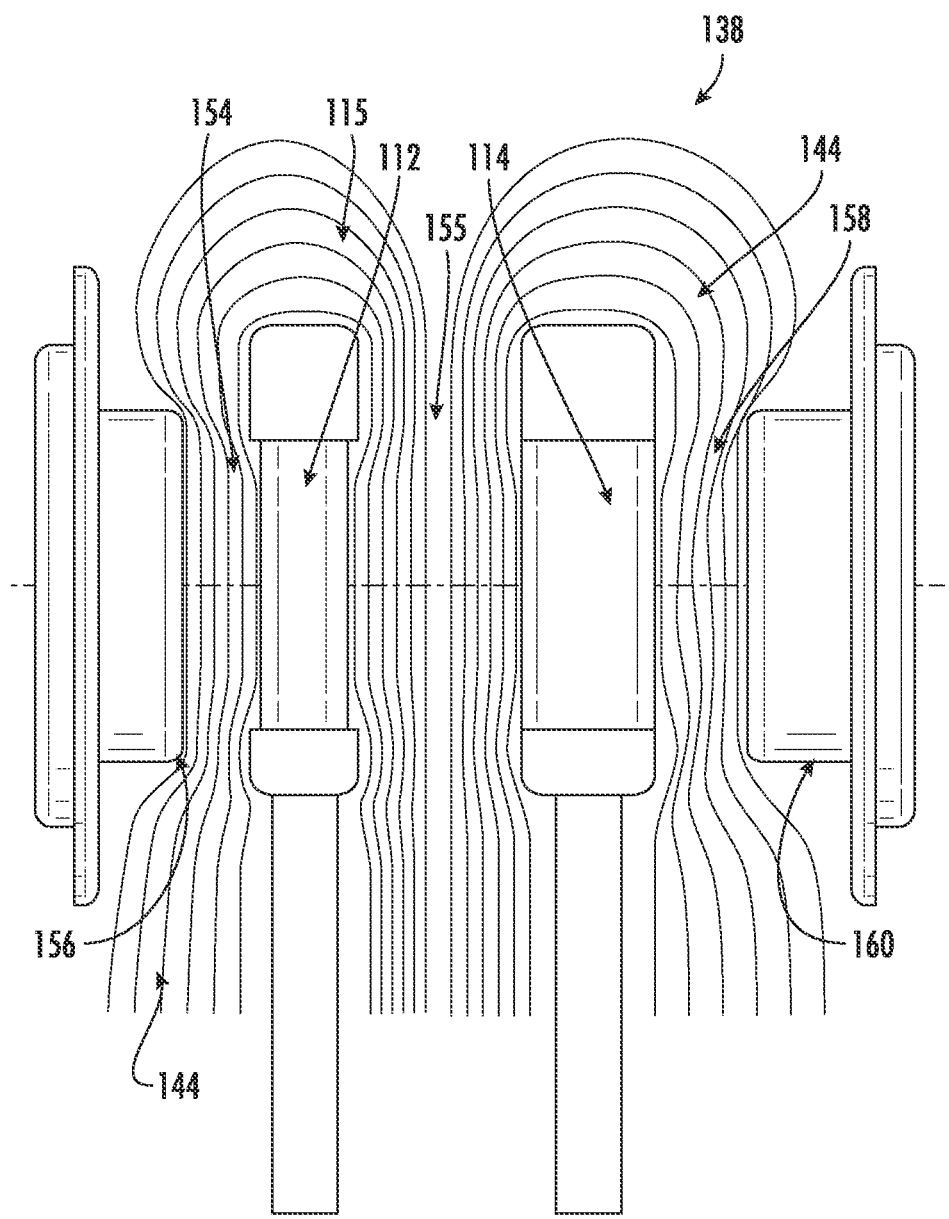
FIG. 2B depicts a perspective view of an electrode assembly of the resonator of FIG. 1B in accordance with embodiments of the present disclosure.

FIG. 2B demonstrates an electrode assembly 138 operable with the coil assembly 115 according to embodiments of the present disclosure. In this embodiment, the electrostatic energy of the electrode assembly 138 may manifest as electrostatic potential difference, demonstrated as contour lines 144, between the energized openings of the first electrode 112 and the second electrode 114. In some embodiments, the electrostatic potential difference $W_{elec}$ is given by the following equation:

$$W_{elec} = \frac{\varepsilon_0 E^2}{2} \quad (3)$$

where E represents electric field strength and $\varepsilon_0$ represents dielectric permittivity of the vacuum within the internal cavity 104.

More specifically, supposing the ions travel from left to right in FIG. 2B, and amplitude of the oscillating electrostatic potential is $V_{max}$, the three-gap acceleration of the coil assembly 115 works as follows. When ions at an exit of a first grounded electrode 156 have an appropriate phase, the ions will see a potential drop $[0-(-V_{max})]$ and will be accelerated across a first gap 154 and toward the first electrode 112, which is energized. A maximum energy that the ions can gain is equal to the charge the ions transport (q) multiplied by the voltage $V_{max}$. If a distance of the first gap 154 and a second gap 155, which is disposed between the first electrode 112 and the second electrode 114, are calculated together with the electrode lengths at the exit from the first electrode 112, the ions will see a $2V_{max}$ potential drop $[V_{max}-(-V_{max})=2 V_{max}]$. Therefore the energy the ions will gain crossing the second gap 155 will be double the energy gained crossing the first gap 154. Finally, for a third gap 158, which is between the second electrode 114 and a second grounded electrode 160, the potential drop seen by the ions will be $V_{max}$, and the ions will gain an additional $qV_{max}$ energy, thus resulting in a $4qV_{max}$ total energy at an entrance in the second grounded electrode 160.

For an ideal case (i.e., no losses) the magnetic energy will convert entirely into electrostatic energy resulting in 1:1 energy conversion from the coil assembly 115 (magnetic energy) to the accelerating ion (kinetic energy). However, in real systems there are losses which limit this energy conversion. In this case, the energy transfer may be quantified by the quality factor Q of the resonator 100, which is given by the following equation:

$$Q = 2\pi f_0 \frac{\text{Energy stored}}{\text{Power dissipated}} \quad (4)$$

The total energy stored in the resonator 100 will be equal to the total energy stored in the coil assembly, which is given by the following equation:

$$W_{mag}^{max} = L_{coil}I^2 \quad (5)$$

wherein I represents the rms value of the electrical current flowing through the coil assembly 115. On other hand, the power dissipated in the resonator 100 is given by the following equation:

$$P_{diss} = R_{echiv}I^2 \quad (6)$$

wherein $R_{echiv}$ represents the equivalent resistance of the resonator circuit. Under resonance conditions, this leads to $$Q = \frac{\omega_0 L_{coil}}{R_{equiv}} = \frac{X_{Lcoil}}{R_{equiv}} \quad (7)$$

wherein $X_{Lcoil}$ is the inductive reactance of the coil assembly 115.

Equation (7) demonstrates that in order to increase the quality factor Q, $X_{Lcoil}$ may be increased and $R_{equiv}$ decreased. However, resonant cavities are configured to operate at a given resonant frequency. As a result, changing coil inductance will change the resonant frequency.

Figure 3:
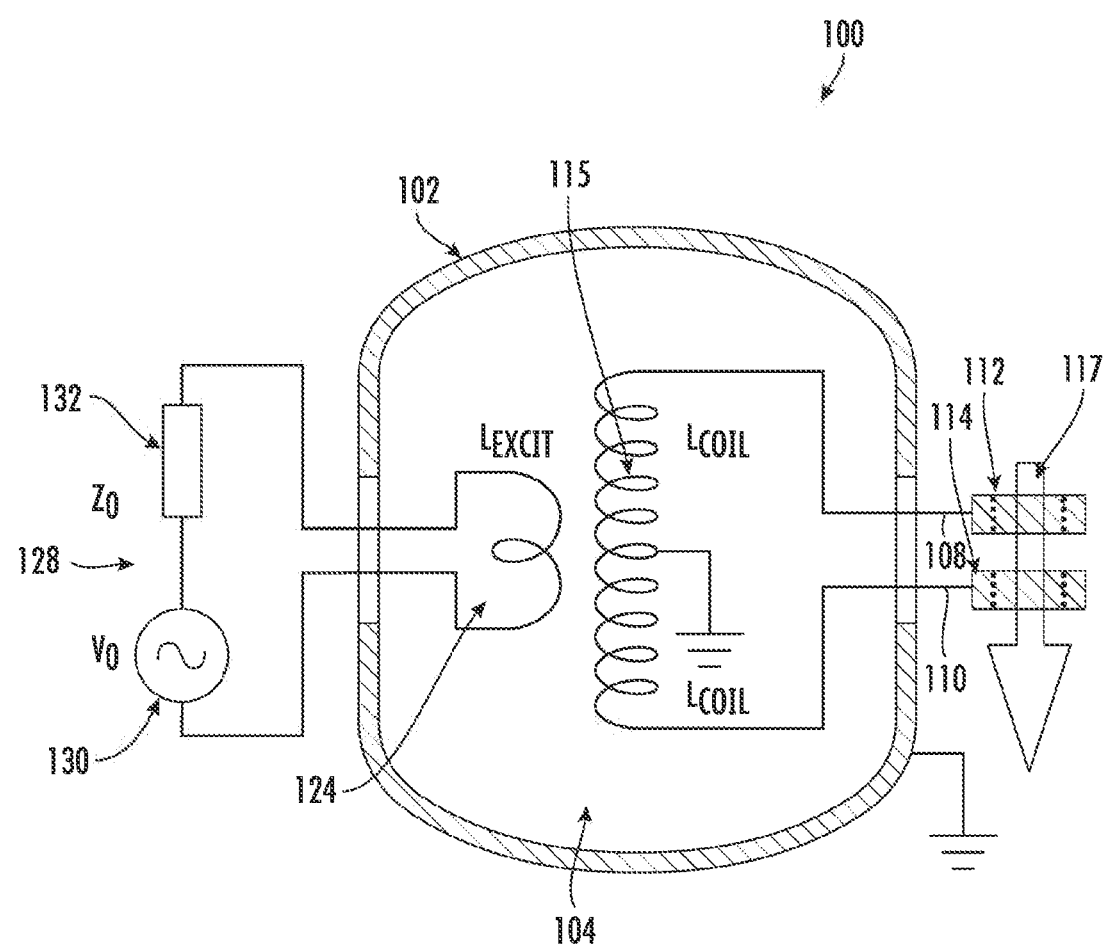
FIG. 3 depicts a circuit diagram of the resonator of FIG. 1B in accordance with embodiments of the present disclosure.

One approach for decreasing $R_{equiv}$ according to embodiments of the present disclosure is demonstrated by the the resonant RF cavity of FIG. 3. As shown, the resonator 100 may further include an exciter coil 124 within the internal cavity 104. The exciter coil 124 may be positioned in close proximity to the coil assembly 115 to transfer energy (e.g., RF energy) from an energy source 128. In some embodiments, the energy source 128 includes an RF generator 130, wherein impedance $(Z_0)$ 132 is the impedance of the RF generator 130, which may be equal to 50 ohms.

Figure 4:
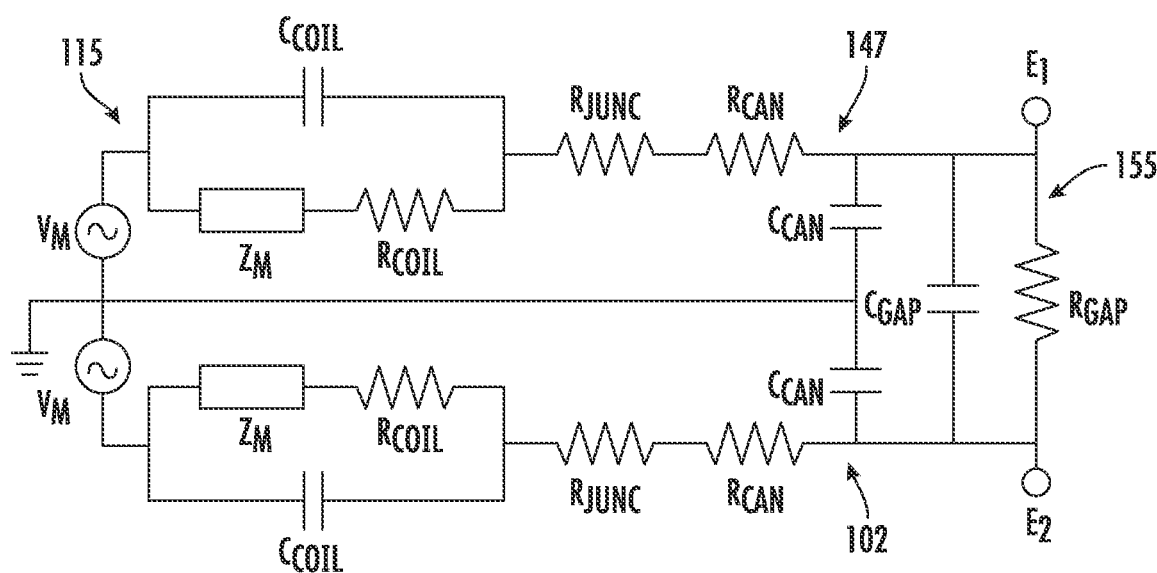
FIG. 4 depicts a lumped element circuit in accordance with embodiments of the present disclosure.

In one example, in order to find the analytical expression of Q, the internal cavity 104 may be modeled as a lumped element circuit 170, shown in FIG. 4. In this example, $R_{coil}$ is the resistance of the coil assembly 115, $R_{junc}$ is the resistance of a junction 147 between the coil assembly 115 and the housing 102, $R_{can}$ is the resistance of the housing 102, and $R_{gap}$ is the resistance of the second gap 155. Based on circuitry analysis, it can be shown that equivalent resistance can be written as $$R_{equiv} \approx 2(R_{coil}+R_{junc}+R_{can})+\lambda R_{gap} \quad (8)$$

where X is a number between 0 and 1.

The resistance of the RF resonant cavity can be decreased by increasing the size of the housing 102 (smaller induced image current), but this will increase the can capacity and alter the resonant frequency. The resistance of the junction to ground and the gap resistance are difficult to modify. Therefore, an effective way to increase the quality factor is to decrease the coil resistance, which is given by the following equation:

$$R_{coil} = \rho \frac{\ell}{A} \quad (9)$$

where $\rho$ is the resistivity of the coil material, l the length of the coil tubing, and A the cross-sectional area through which the electric current is flowing through the coil assembly 115.

Thus, the total coil length will not be affected, but the current will see a wider cross-section and therefore the coil resistance will decrease.

Figure 5:
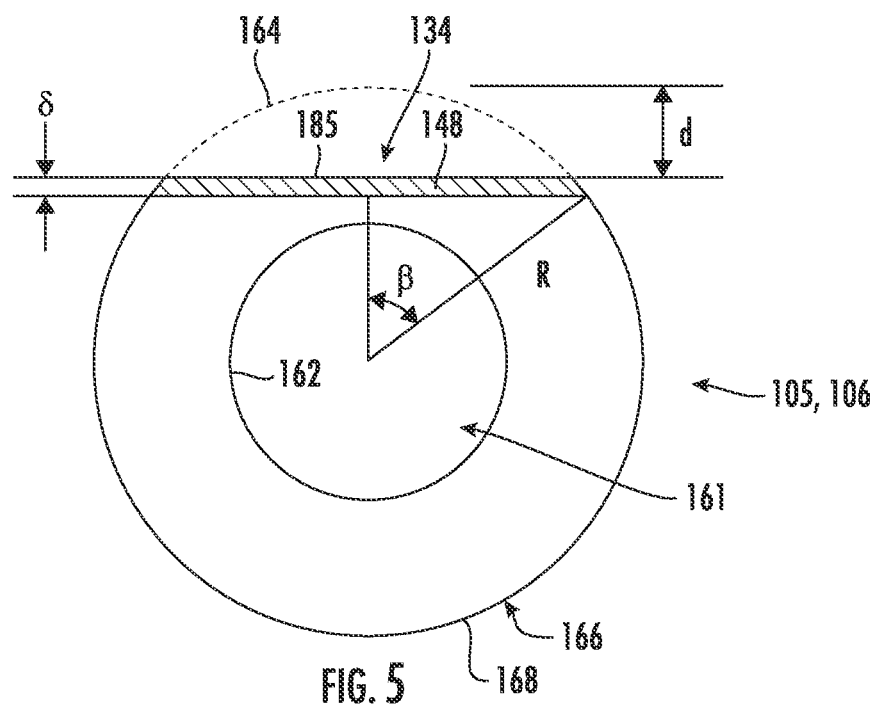
FIG. 5 depicts an end, cross-sectional view of a coil of the resonator of FIG. 1B in accordance with embodiments of the present disclosure.

Turning now to the end, cross-sectional view of FIG. 5, the first and second coils 105, 106 according to embodiments of the present disclosure will be described in greater detail. As shown, the first and second coils 105, 106 may have an asymmetrical profile, wherein a first, inner side 134 has a flattened surface 185 and a second, outer side 166 has a curved surface 168. In this embodiment, an internal channel 161 is defined by an internal surface 162 of the first and second coils 105, 106. Although shown as having a circular profile, it'll be appreciated that the internal channel 161 may take on any variety of shapes.

As depicted, the first and second coils 105, 106 may be flattened or reduced from a circular profile 164 (as shown by dashed line) by a distance 'd' along a radial direction. Unlike direct current, RF current does not flow through the whole radial cross-section of the first and second coils 105, 106 but through a small skin layer 148 at the inner side 134. The thickness of the skin layer 148 may be defined by the following equation:

$$\delta = \sqrt{\frac{2\rho}{2\pi f \mu_0 \mu_r}}$$

wherein f is the RF frequency and wherein $\mu_0 = 4\pi \times 10^{-7}$ H/m and $\mu_r$ are the magnetic permeability of the vacuum and the relative permeability of the material of the first and second coils 105, 106. If copper material is used for the first and second coils 105, 106, then the thickness/depth of the skin layer 148 at 22 MHz is approximately 15 µm.

Furthermore, the cross-sectional area through which current flows (hashed area) may be defined by the following equation:

$$A_2 \simeq 2\delta\sqrt{2dR}$$

Compared to the circular profile 164, a flattening of the first coil 105 and the second coil 106, for example, by a distance of approximately 1 mm, may result in a 16-fold increase in the cross-sectional area of the skin layer 148. This will cause a decrease in the equivalent resistance of the first and second coils 105, 106. Meanwhile, providing the outer side 166 with a curved surface or curved profile reduces an amount of electric stress, e.g., present with rectangular shaped electrodes due to the small radii of curvature, which increases multipacting and the risk of dielectric breakdown.

Figure 6:
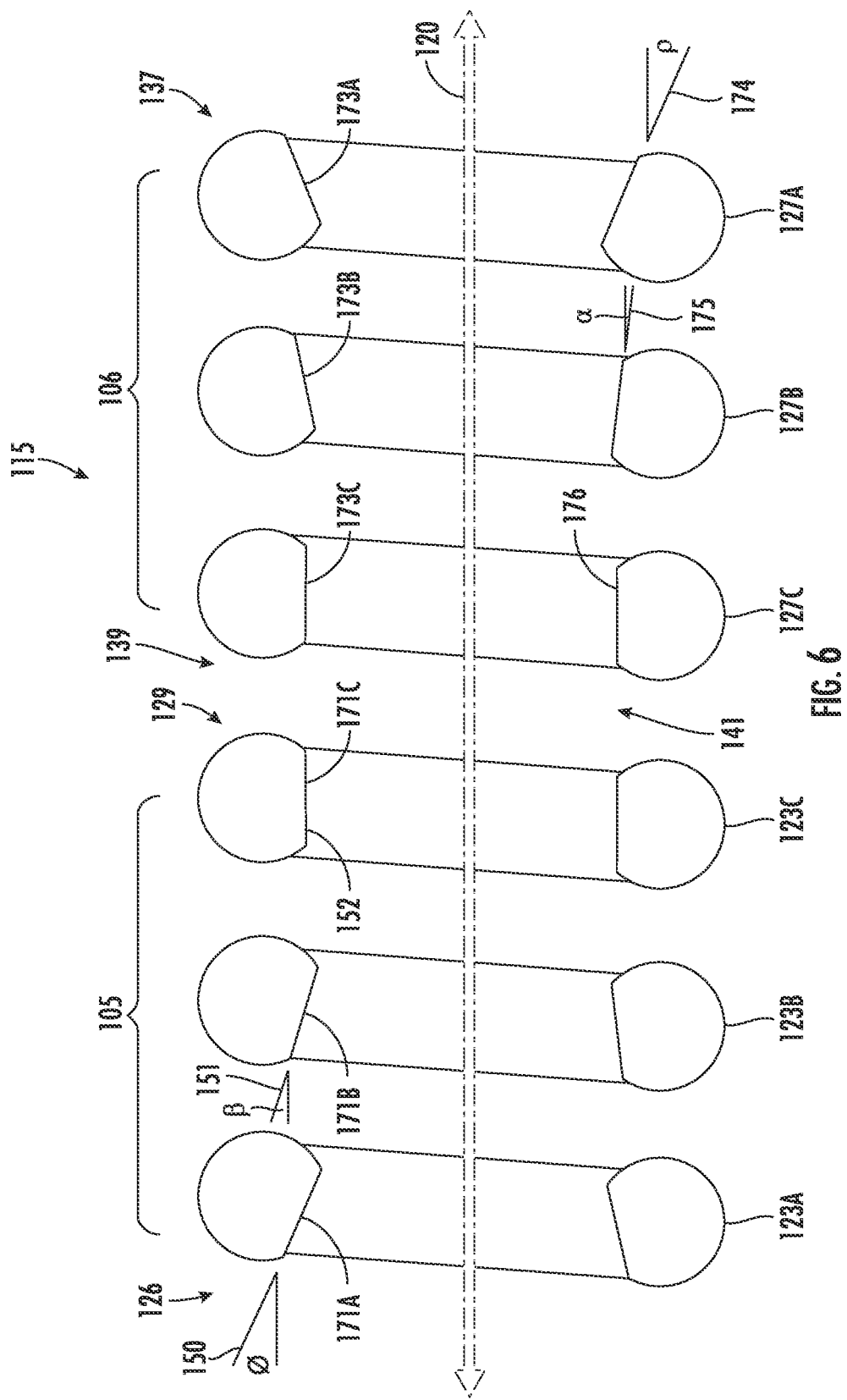
FIG. 6 depicts a side, cross-sectional view of a coil assembly of the resonator of FIG. 1B in accordance with embodiments of the present disclosure.

Turning now to the side, cross-sectional view of FIG. 6, a simplified depiction of the coil assembly 115 including the first and second coils 105, 106 according to embodiments of the present disclosure will be described in greater detail. As shown, the first coil 105 includes the first plurality of loops 123A-123C and the second coil 106 includes the second plurality of loops 127A-127C. Although only three (3) loops are shown for each of the first coil 105 and the second coils 106 for ease of explanation, it'll be appreciated that a lesser or greater number of loops is possible.

The first plurality of loops 123A-123C and the second plurality of loops 127A-127C may be winded in a same direction about the central axis 120. As shown, the first plurality of loops 123A-123C and the second plurality of loops 127A-127C may generally have a same or similar radius. The first plurality of loops 123A-123C may include a first axial end 126 opposite a second axial end 129, and the second plurality of loops 127A-C may include a third axial end 137 opposite a fourth axial end 139. The first axial end 126 and the third axial end 137 correspond to opposite ends of the overall coil assembly 115, while the second axial end 129 and fourth axial end 139 are positioned directly adjacent one another along an interior 141 defined by first and second coils 105, 106. In some embodiments, each of the first plurality of loops 123A-123C and the second plurality of loops 127A-127C may be spaced equidistant apart from one another, e.g., along the central axis 120.

As shown, each of the first plurality of loops 123A-123C has a corresponding first flattened surface 171A-171C, while each of the second plurality of loops 127A-127C has a corresponding second flattened surface 173A-173C. Each of the first flattened surfaces 171A-171C and second flattened surfaces 173A-173C define corresponding planes. For example, first flattened surface 171A may define a first plane 150 disposed at a non-zero angle φ with respect to the central axis 120. First flattened surface 171B may define a second plane 151 disposed at non-zero angle β with respect to the central axis 120. In some embodiments, φ>β. Meanwhile, first flattened surface 171C may define a third plane 152, which is generally parallel to the central axis 120.

Similarly, second flattened surface 173A may define a fourth plane 174 disposed at a non-zero angle ρ with respect to the central axis 120. In some embodiments, non-zero angle φ of the first plane 150 may be the same as the non-zero angle ρ of the fourth plane 174. Second flattened surface 173B may define a fifth plane 175 disposed at non-zero angle α with respect to the central axis 120. In some embodiments, non-zero angle β of the second plane 151 may be the same as the non-zero angle α of the fifth plane 175. In some embodiments, ρ>α. Meanwhile, second flattened surface 173C may define a sixth plane 176, which is generally parallel to the central axis 120 and to the third plane 152. In some embodiments, the first and second plurality of loops 123A-123C, 127A-127C may have a generally D-shaped profile.

As demonstrated, the first flattened surface 171A and the second flattened surface 173C flare outwardly at the first axial end 126 and the third axial end 137, respectively. As a result, the area of the coil surface that is carrying the current is greatly increased, significantly reducing the resistance of the RLC circuit and improving the Q.

Figure 7:
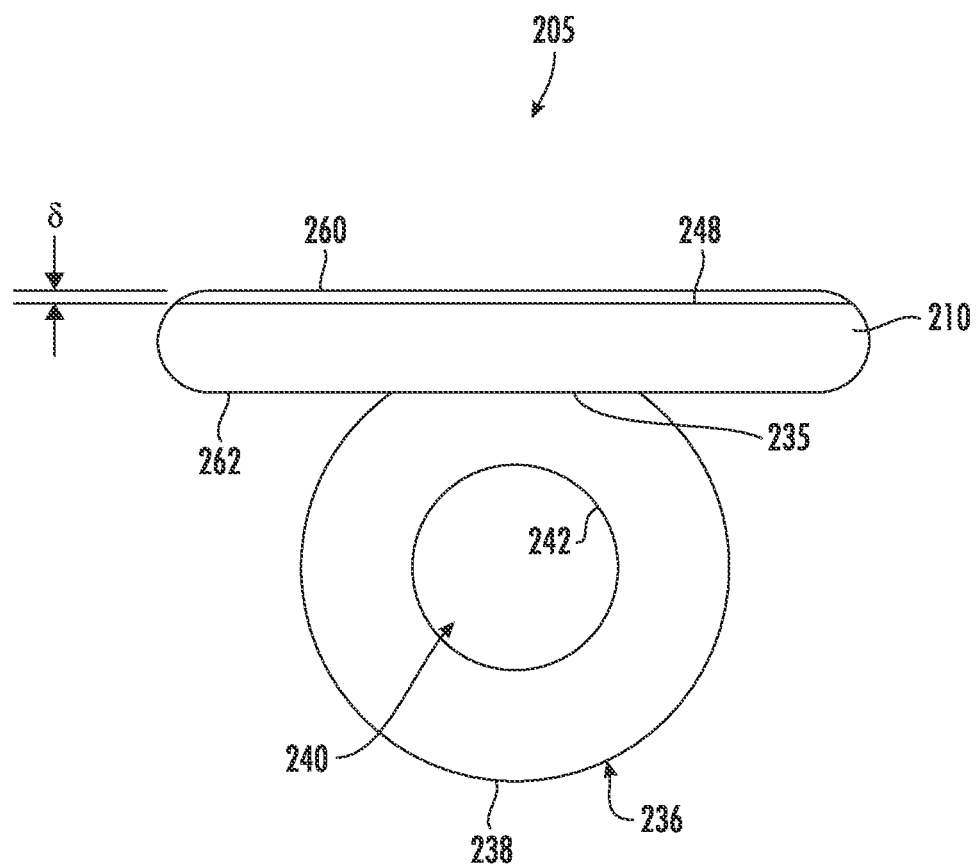
FIG. 7 depicts an end, cross-sectional view of a coil in accordance with embodiments of the present disclosure.

Turning now to the end, cross-sectional view of FIG. 7, an alternative coil 205 according to embodiments of the present disclosure will be described. As shown, the coil 205 may have an asymmetrical profile, wherein a first, inner side 234 has a flattened surface 235 and a second, outer side 236 has a curved surface 238. In this embodiment, an internal channel 240 is defined by an internal surface 242. Although shown as having a circular profile, it'll be appreciated that the internal channel 240 may take on any variety of shapes.

As shown, the coil 205 may include a planar component 210 extending axially along a length thereof. The planar component 210 may be provided to further increase an area of a skin layer 248 available to carry the current and thus further reduce the equivalent resistance of the coil 205. Although non-limiting, the planar component 210 may include a first main surface 260 opposite a second main surface 262. The skin layer 248 may extend along the first main surface 260.

In view of the foregoing, at least the following advantages are achieved by the embodiments disclosed herein. A first advantage includes driving up the quality factor by decreasing the resistance of the coil assembly. A second advantage includes increasing the available acceleration voltage as a result of the higher quality factor.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Furthermore, identification references (e.g., primary, secondary, first, second, third, fourth, etc.) are not intended to connote importance or priority, but are used to distinguish one feature from another.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, although the illustrative methods described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. For example, the herein described process sequence of performing the implant process, formation of stress film, annealing, and removal of the stress film can be repeated a number of times to create multiple stress memorization layers or areas.

In addition, not all illustrated acts or events may be required to implement a methodology in accordance with the present disclosure. Furthermore, the methods may be implemented in association with the formation and/or processing of structures illustrated and described herein as well as in association with other structures not illustrated.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A resonator, comprising:
   a conductive hollow tube, comprising:
      a first end coupled to a first electrode, the first electrode operable to accelerate ions;
      a central section connected to the first end, wherein the central section extends about a central axis, wherein an inner side of the central section has a flattened surface, and wherein an outer side of the central section has a curved surface; and
      a second end connected to the central section.

2. The resonator of claim 1, wherein the central section extends helically about the central axis.

3. The resonator of claim 1, wherein the central section comprises:
   a first axial end and a second axial end; and
   a plurality of loops extending between the first and second axial ends, wherein a first loop of the plurality of loops includes a first flattened surface defining a first plane, wherein a second loop of the plurality of loops includes a second flattened surface defined a second plane, and wherein a first angle, with respect to the central axis, of the first plane is different than a second angle of the second plane.

4. The resonator of claim 3, wherein the first angle is greater than the second angle.

5. The resonator of claim 3, wherein the first loop is positioned at the first axial end, and wherein the second loop is positioned at the second axial end.

6. The resonator of claim 1, further comprising a second conductive hollow tube coupled to a second electrode, wherein an ion beam is operable to pass through the first and second electrodes, and wherein the second conductive hollow tube comprises plurality of loops extending helically about the central axis.

7. The resonator of claim 6, wherein the conductive hollow tube is disposed within a housing, and wherein the second end of the conductive hollow tube is coupled to the housing.

8. The resonator of claim 7, further comprising:
an exciter coil within the housing; and
an energy source connected with the exciter coil for providing radio frequency (RF) energy to the conductive hollow tube and to the second conductive hollow tube.

9. A resonator, comprising:
a coil disposed within a housing, the coil comprising:
a first end coupled to a first electrode, the first electrode operable to accelerate ions;
a central section connected to the first end, wherein the central section extends helically about a central axis, wherein an inner side of the central section has a flattened surface, and wherein an outer side of the central section has a curved surface; and
a second end connected to the central section, wherein an internal channel extending between the first and second ends is operable to transport a fluid.

10. The resonator of claim 9, wherein the central section comprises:
a first axial end and a second axial end; and
a plurality of loops extending between the first and second axial ends, wherein the inner side of a first loop of the plurality of loops defines a first plane, wherein the inner side of a second loop of the plurality of loops defines a second plane, and wherein a first angle of the first plane, with respect to the central axis, is different than a second angle of the second plane, with respect to the central axis.

11. The resonator of claim 10, wherein the first loop is positioned at the first axial end, wherein the second loop is positioned at the second axial end, and wherein the first angle is greater than the second angle.

12. The resonator of claim 9, further comprising a second coil within the housing, wherein the second coil is coupled to a second electrode, and wherein an ion beam is operable to pass through the first and second electrodes.

13. The resonator of claim 12, wherein the second end of the coil is coupled to the housing.

14. A resonator of an ion implanter, the resonator comprising:
a housing defining an internal cavity;
a hollow coil partially disposed within the internal cavity, the hollow coil comprising:
a first end coupled to a first electrode, the first electrode operable to accelerate ions;
a central section connected to the first end, wherein the central section extends helically about a central axis, wherein an inner side of the central section has a flattened surface, and wherein an outer side of the central section has a curved profile; and
a second end connected to the central section and to the housing.

15. The resonator of claim 14, wherein the central section comprises:
a first axial end and a second axial end; and
a plurality of loops extending between the first and second axial ends, wherein the inner side of a first loop of the plurality of loops defines a first plane, wherein the inner side of a second loop of the plurality of loops defines a second plane, and wherein a first angle of the first plane, relative to the central axis, is different than a second angle of the second plane, relative to the central axis.

16. The resonator of claim 15, wherein the first loop is positioned at the first axial end, wherein the second loop is positioned at the second axial end, and wherein the first angle is greater than the second angle.

17. The resonator of claim 14, further comprising a second coil partially disposed within the internal cavity, wherein the second coil is coupled to a second electrode and to the housing, and wherein an ion beam is operable to pass through the first and second electrodes.

18. The resonator of claim 14, wherein the flattened surface faces the central axis.

19. The resonator of claim 14, wherein the hollow coil has a D-shaped profile.

* * * * *